United States Patent
Christie et al.

(10) Patent No.: US 10,373,811 B2
(45) Date of Patent: Aug. 6, 2019

(54) SYSTEMS AND METHODS FOR SINGLE MAGNETRON SPUTTERING

(71) Applicant: Advanced Energy Industries, Inc., Fort Collins, CO (US)

(72) Inventors: David Christie, Fort Collins, CO (US); Skip B. Larson, Fort Collins, CO (US)

(73) Assignee: AES GLOBAL HOLDINGS, PTE. LTD, Singapore (SG)

( * ) Notice: Subject to any disclaimer, the term of this patent is extended or adjusted under 35 U.S.C. 154(b) by 209 days.

(21) Appl. No.: 14/809,084

(22) Filed: Jul. 24, 2015

(65) Prior Publication Data

US 2017/0022604 A1    Jan. 26, 2017

(51) Int. Cl.
    *C23C 14/34* (2006.01)
    *H01J 37/34* (2006.01)

(52) U.S. Cl.
    CPC ...... *H01J 37/3476* (2013.01); *C23C 14/3485* (2013.01); *C23C 14/3492* (2013.01); *H01J 37/3405* (2013.01); *H01J 37/3438* (2013.01); *H01J 37/3488* (2013.01)

(58) Field of Classification Search
    CPC ............. H01J 37/3476; C23C 14/3485; C23C 14/3492
    USPC .................... 204/192.1; 427/569; 315/111.21
    See application file for complete search history.

(56) References Cited

U.S. PATENT DOCUMENTS

| | | |
|---|---|---|
| 4,478,700 A | 10/1984 | Criss |
| 5,427,298 A | 6/1995 | Tegtmeier |
| 5,897,753 A | 4/1999 | Schatz et al. |
| 6,183,605 B1 | 2/2001 | Schatz et al. |
| 6,222,321 B1 | 4/2001 | Scholl et al. |
| 6,338,777 B1 | 1/2002 | Longstreth White |

(Continued)

FOREIGN PATENT DOCUMENTS

| | | |
|---|---|---|
| CN | 102985996 A | 3/2013 |
| DE | 102009051056 A1 | 5/2011 |

(Continued)

OTHER PUBLICATIONS

Weekes, Chris, "International Search Report and Written Opinion re Application No. PCT/US2016/042389", dated Oct. 20, 2016, p. 11, Published in: AU.

(Continued)

*Primary Examiner* — Jason Berman
(74) *Attorney, Agent, or Firm* — Neugeboren O'Dowd PC

(57) ABSTRACT

A system and method for single magnetron sputtering are described. One example includes a system having a power supply, a plasma chamber enclosing a substrate, an anode, and a target for depositing a thin film material on the substrate. This example also has a datastore with uncoated anode characterization data and an anode sputtering adjustment system including an anode analysis component to generate a first health value. The first health value is indicative of whether the anode is coated with a dielectric material. This example also has an anode power controller to receive the first health value and provide an anode-energy-control signal to the pulse controller of the pulsed DC power supply to adjust a second anode sputtering energy relative to a first anode sputtering energy to eject at least a portion of the dielectric material from the anode.

2 Claims, 13 Drawing Sheets

(56) References Cited

U.S. PATENT DOCUMENTS

| | | |
|---|---|---|
| 9,812,305 B2 | 11/2017 | Pelleymounter |
| 2004/0075060 A1 | 4/2004 | Luten et al. |
| 2006/0278518 A1* | 12/2006 | Kouznetsov .......... C23C 14/345 204/192.1 |
| 2010/0196624 A1* | 8/2010 | Ruuttu ................ B23K 26/067 427/569 |
| 2010/0276283 A1 | 11/2010 | Muenz et al. |
| 2011/0120860 A1 | 5/2011 | Horishita et al. |
| 2011/0248633 A1* | 10/2011 | Nauman ............. C23C 14/3485 315/111.21 |
| 2014/0234616 A1 | 8/2014 | Hultman et al. |
| 2016/0314946 A1 | 10/2016 | Pelleymounter |
| 2018/0108520 A1 | 4/2018 | Pelleymounter |
| 2018/0130648 A1 | 5/2018 | Pelleymounter |

FOREIGN PATENT DOCUMENTS

| | | |
|---|---|---|
| EP | 0692138 B1 | 1/2004 |
| EP | 1458006 A1 | 9/2004 |
| EP | 2439763 A2 | 4/2012 |
| JP | H0397846 A | 4/1991 |
| WO | 02103078 A1 | 12/2002 |
| WO | 2007051461 A1 | 5/2007 |
| WO | 2009040406 A2 | 4/2009 |

OTHER PUBLICATIONS

Scholl, R., "Redundant Anode Sputtering: A Novel Approach to the Disapperaing Anode Problem", "Retrieved from http://www.advanced-energy.com/upload/File/White_Papers/SL-WHITE2-270-01.pdf", Jan. 1, 2000, p. 8.

Hochstrasser, M., "Extended European Search Report Re Application No. 16831032.4", , p. 6, Published in: EP.

Andrew Rapson, "International Search Report and Written Opinion Re Application No. PCT/US2018/016223", dated May 7, 2018, p. 15, Published in: AU.

Aguilar, Maria, "European Search Report Re Application No. EP16165652", dated Aug. 18, 2016, p. 2 Published in: EP.

Wanga, Timon, "United States Office Action Re U.S. Appl. No. 14/697,267", dated Jan. 25, 2017, p. 18, Published in: US.

Schneider, Laura A., "Response to United States Office Action Re U.S. Appl. No. 14/697,267", dated Apr. 17, 2017, p. 11, Published in: US.

SIPO, "Office Action Regarding Chinese Patent Application No. 201680003857.6", dated Dec. 26, 2018, p. 15, Published in: CN.

* cited by examiner

SYSTEMS AND METHODS FOR SINGLE MAGNETRON SPUTTERING

FIELD OF THE INVENTION

The present invention relates to sputtering. In particular, but not by way of limitation, the present invention relates to systems and methods for single magnetron sputtering.

BACKGROUND OF THE INVENTION

Sputtering historically includes generating a magnetic field in a vacuum chamber and causing a plasma beam in the chamber to strike a sacrificial target, thereby causing the target to sputter (eject) material, which is then deposited as a thin film layer on a substrate. Sputtering sources may employ magnetrons that utilize strong electric and magnetic fields to confine charged plasma particles close to the surface of the target. An anode is generally provided to collect electrons from the plasma to maintain plasma neutrality as ions leave to bombard the target. In use, however, the anode becomes coated with an insulating (dielectric) film, and the sputtering process is adversely affected. The industry has attempted over the years to provide sputtering systems that limit the amount of coating that builds up on the anode.

Although the currently available devices and methods are functional, it is desirable to improve power usage efficiencies and/or material consumption, as well as to provide other useful innovations in single magnetron sputtering systems.

SUMMARY OF THE INVENTION

The present invention can provide a system or method for single magnetron sputtering. Embodiments disclosed herein may provide improvements in single magnetron sputtering systems, and some aspects are summarized below.

In one example, the present invention can include a system for single magnetron sputtering. This system has a plasma chamber enclosing a substrate, an anode, and a target for depositing a thin film material on the substrate. This system also has a pulsed DC power supply coupled to the target and the anode, the pulsed power supply including a pulse controller to supply both a first target sputtering energy to the target with a first voltage polarity and a second target sputtering energy to the target with the first voltage polarity, the pulse controller configured to supply a first anode sputtering energy immediately following the first target sputtering energy with a second voltage polarity, and supply a second anode sputtering energy immediately following the second target sputtering energy with the second voltage polarity, wherein the second voltage polarity is opposite the first voltage polarity. This system also has an anode monitor system comprising a voltage monitor to detect a first anode voltage at a first process variable value. This system also has a datastore comprising uncoated anode characterization data derived from characteristics of an uncoated anode that is not coated with a dielectric material, the uncoated anode characterization data including a first expected anode voltage stored in association with the first process variable value. This system also has an anode sputtering adjustment system coupled to the datastore and the anode monitor system, the anode sputtering adjustment system including: an anode analysis component to generate, based upon a difference between the first anode voltage and the first expected anode voltage, a first health value. In this system, the first health value is indicative of whether the anode is coated with the dielectric material. This system also has an anode power controller to receive the first health value and provide an anode-energy-control signal to the pulse controller of the pulsed DC power supply. This adjusts the second anode sputtering energy relative to the first anode sputtering energy to eject at least a portion of the dielectric material from the anode.

In another example, the present invention can include a power supply system for a single magnetron sputtering system. This power supply system has a target lead to couple to a target and an anode lead to couple to an anode. This power supply system also has a pulse controller to alternately apply target sputtering energy to the target lead and anode sputtering energy to the anode lead, and an anode monitor system to monitor a voltage of the anode lead. This power supply system also has a datastore configured to store uncoated anode characterization data including a first expected anode voltage stored in association with a first process variable value. This power supply system also has an anode energy adjustment system having an output to instruct the pulse controller to adjust the anode sputtering energy when the monitored anode voltage at the first process variable value is greater than a threshold deviation from the first expected anode voltage.

In still another example, the present invention can include a method for single magnetron sputtering. This method includes enclosing a substrate, an anode, and a target for depositing a thin film material on the substrate in a plasma chamber; and alternately applying target sputtering energy to the target and anode sputtering energy to the anode. This method includes monitoring an anode voltage at a process variable value. This method also includes accessing a datastore, the datastore having uncoated anode characterization data derived from characteristics of an uncoated anode that is not coated with a dielectric material. In this method, the uncoated anode characterization data includes a first expected anode voltage defined by the uncoated anode characterization data of the uncoated anode at a first process variable value. This method also includes obtaining, using the first process variable value, the first expected voltage value, and generating a first health value based upon the difference between the monitored anode voltage and the first expected anode voltage. This method also includes adjusting the anode sputtering energy based upon the first health value to eject material from the anode.

As previously stated, the above-described examples and implementations are for illustration purposes only. Numerous other examples, embodiments, implementations, and details of the invention are easily recognized by those of skill in the art from the following descriptions and claims.

DETAILED DESCRIPTION

As previously mentioned in the summary of this disclosure, and broadly described, a single magnetron sputtering system may be provided in some embodiments. The system may automatically determine a health of an anode, and, responsive to determining the health of the anode, adjust an anode sputtering pulse to eject dielectric material from an anode. The system may also or alternatively provide an operator with a warning as the anode health deteriorates, and/or information about the health of the anode to enable the operator to preemptively modify the sputtering process. Methods for generating anode health data are also disclosed in this document.

Figure 1:
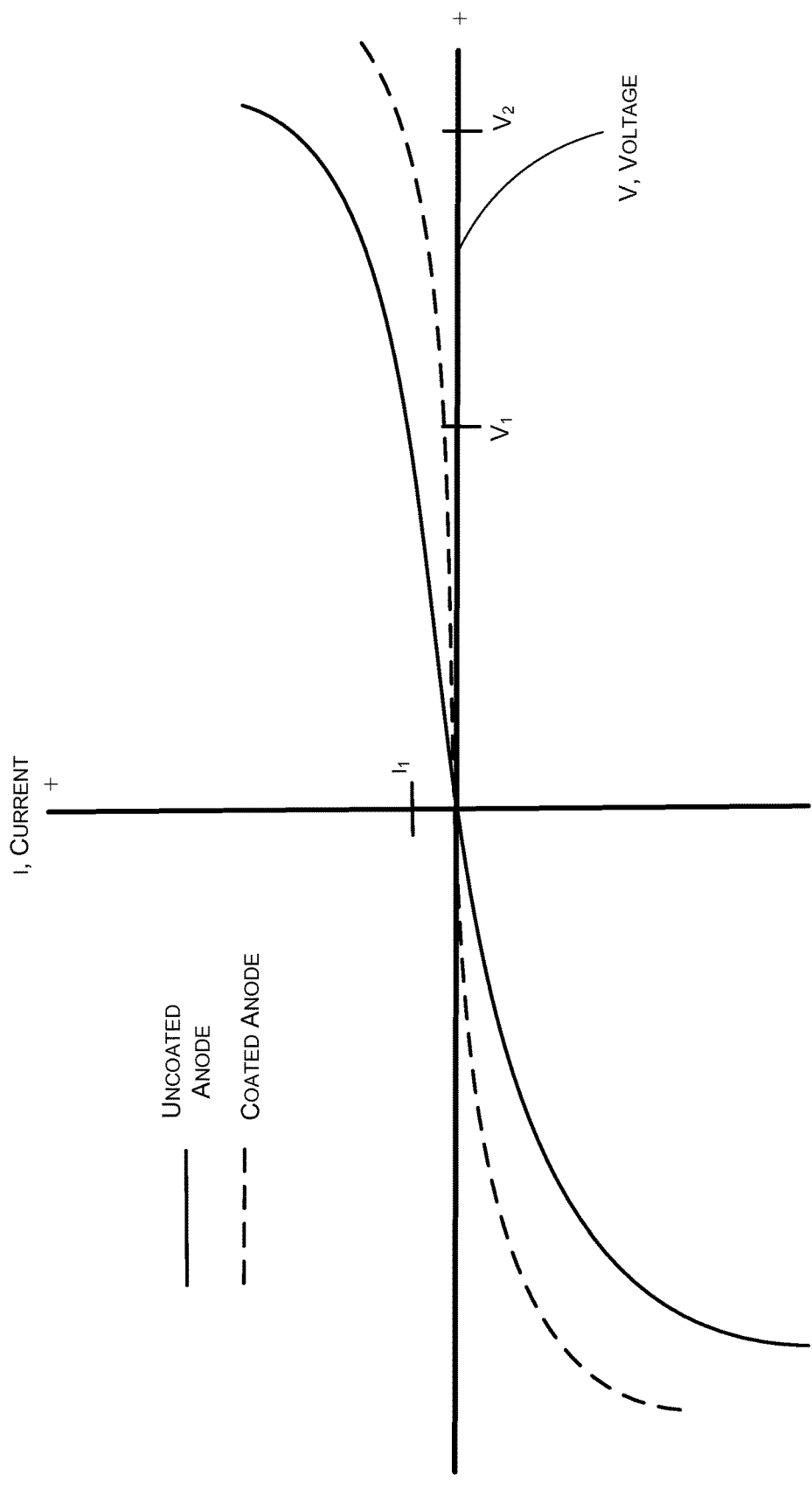
FIG. 1 graphically illustrates voltage-current relationships for uncoated and coated anodes.

With reference to FIG. 1, it is expedient to describe the Applicant's observations as to how an anode behaves during the sputtering process. The Applicant has observed that an anode that is partially or fully coated with a dielectric material behaves differently than does a fresh or uncoated anode. Specifically, when a current $I_1$ is applied to an uncoated or clean anode in a sputtering system, the resulting voltage $V_1$ exhibits a response loosely approximating the solid curve illustrated in FIG. 1. However, as the anode becomes coated with a dielectric material, an application of the same current $I_1$ results in a Voltage $V_2$ that is loosely approximated by the dotted line in FIG. 1. In other words, if the operator desires that a coated or dirty anode operate at the same power as a clean or uncoated anode, at the same current $I_1$, the coated anode must be exposed to a much higher voltage $V_2$ than the voltage $V_1$ that would be required of an uncoated anode.

Figure 2:
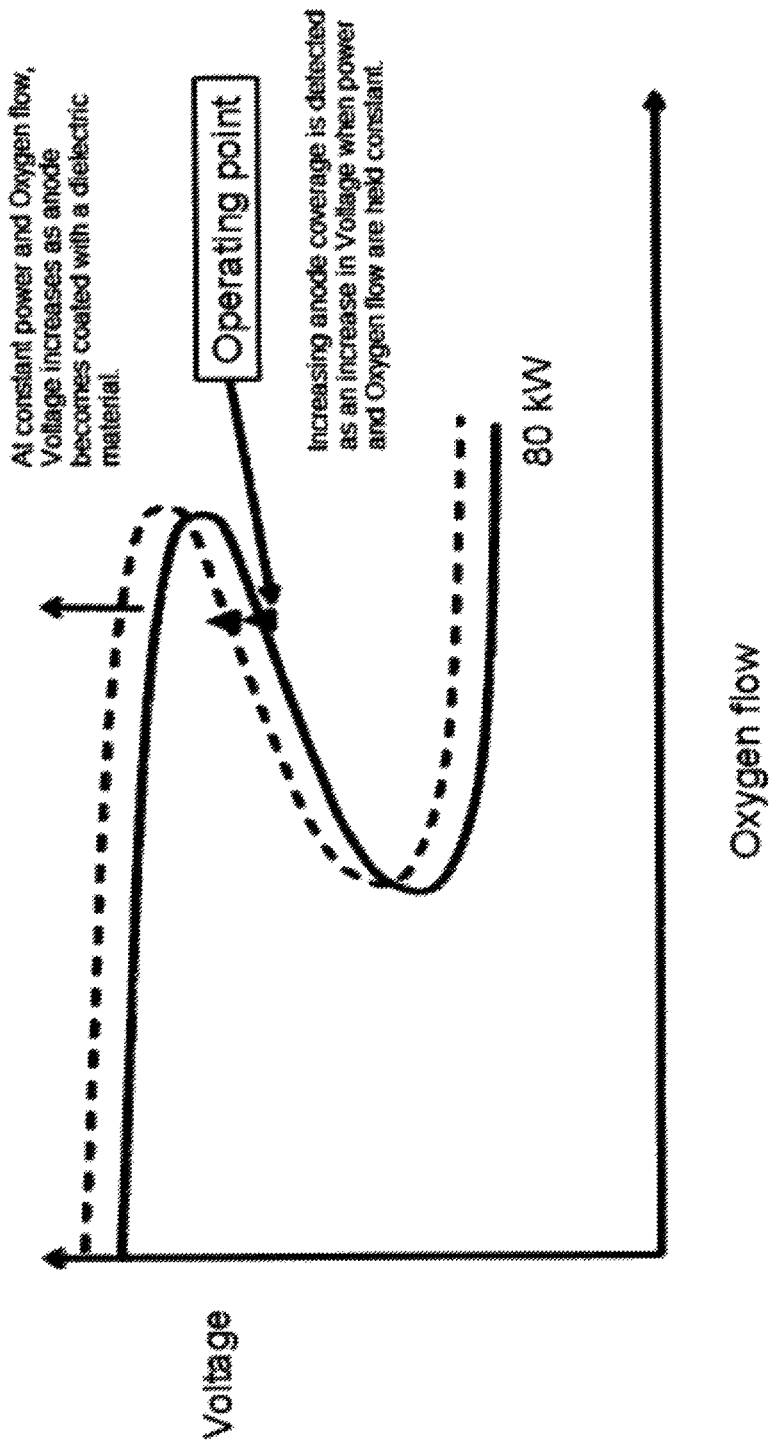
FIG. 2 graphically illustrates voltage-oxygen flow relationships for uncoated and coated anodes.

Turning now to FIG. 2, relatedly, coverage of the anode with a dielectric material affects the voltage curve relative to a gas flow, such as oxygen flow, which is illustrated. As seen at the dotted line, at constant power and oxygen flow, the anode voltage must increase as the anode coating or coverage increases.

Figure 3:
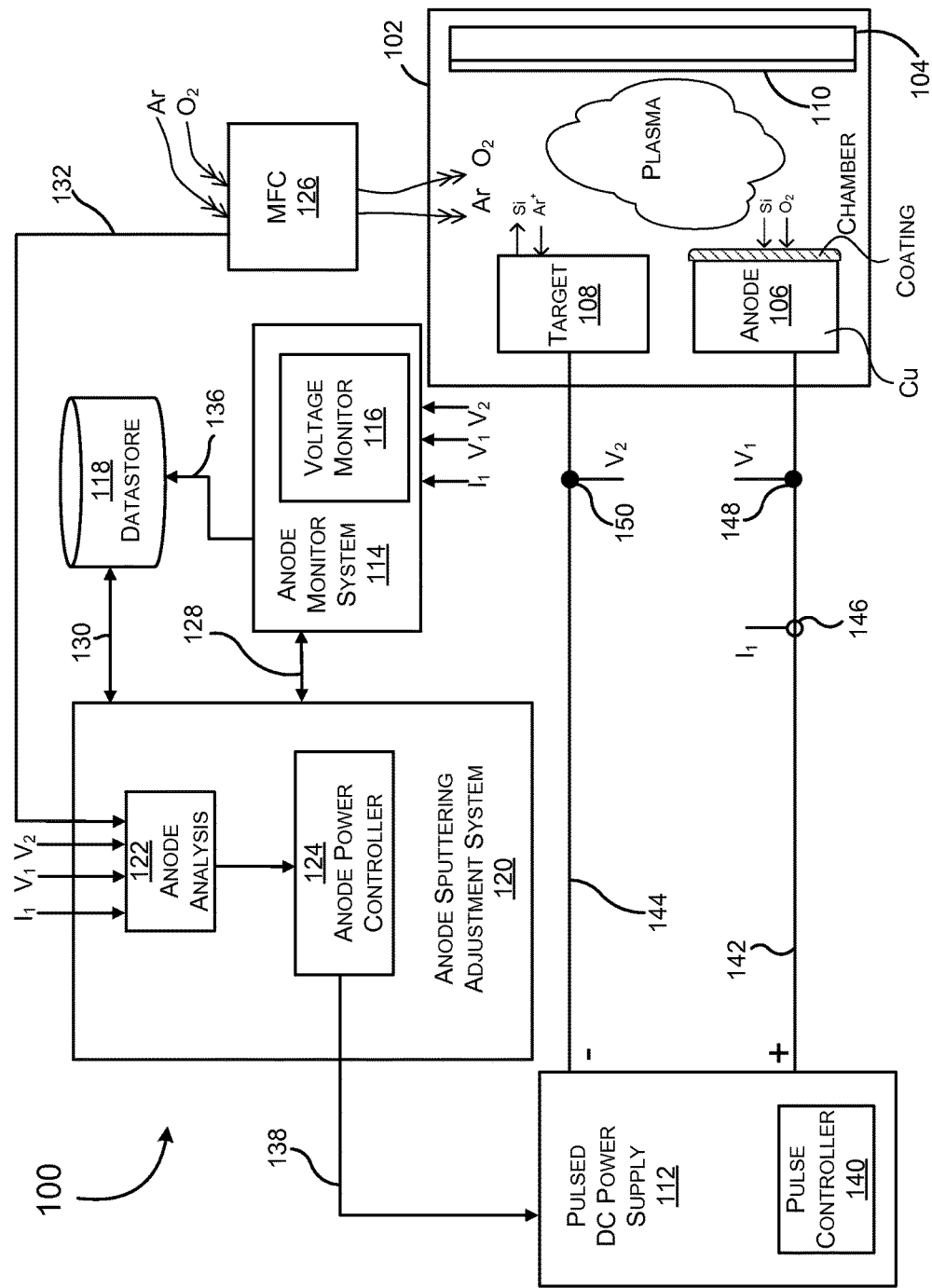
FIG. 3 illustrates an exemplary system for single magnetron sputtering.

Referring now to additional drawings, where like or similar elements are designated with identical reference numerals throughout the several views, and referring in particular to FIG. 3, an overview of a system 100 for single magnetron sputtering is first described. The system 100 in FIG. 3 includes a plasma chamber 102 enclosing a substrate 104, an anode 106, and a target 108 for depositing a thin film 110 on the substrate 104. The illustrated system 100 also includes a mass flow controller 126 for supplying and/or controlling a process gas to the plasma chamber 102. The illustrated system 100 also has a pulsed DC power supply 112, having a pulse controller 140, coupled to the anode 106 and the target 108 by way of the anode lead 142 and the target lead 144 respectively.

The illustrated system 100 also has an anode monitor system 114 having a voltage monitor 116 and operatively coupled to the anode lead 142, the target lead 144, an anode sputtering adjustment system 120 and a datastore 118. The illustrated anode sputtering adjustment system 120 includes an anode power controller 124 and an anode analysis component 122 and is coupled to the datastore 118 and the mass flow controller 126, in addition to the anode monitor system 114. The mass flow controller 126 provides information about the process gas to the anode sputtering adjustment system 120.

The illustrated leads 128, 130, 132, 136, 138 operatively couple the respective components above, to allow the components to transmit data, instructions, and/or signals as described above and in other sections of this document.

A current sensor 146 may be coupled to one or more of the anode lead 142 and target lead 144, while voltage sensors 148, 150 may likewise be coupled to one or more of the anode lead 142 and target lead 144 to provide the anode monitor system 114 and/or the anode sputtering adjustment system 120 with information about the power being supplied to the anode 106 and/or target 108.

Continuing with FIG. 3, the pulsed DC power supply 112 may include a pulse controller 140 to control the alternate application of target sputtering energy to the target lead 144 and anode sputtering energy to the anode lead 142. In some embodiments, the pulsed DC power supply 112 may supply a first target sputtering energy, a first anode sputtering energy, a second target sputtering energy, and a second anode sputtering energy. The first and second target sputtering energy have a first voltage polarity, while the first and second anode sputtering energy have a second voltage polarity that is the opposite of the first voltage polarity.

The pulsed DC power supply 112 may provide a current controlled power supply that generates direct current pulses having alternating polarities to generate high temperature plasmas. A single power source, multiple power sources and/or multiple electrodes can be employed in the pulsed DC power supply 112. The pulsed DC power supply 112 may have reversing switches to cause a substantially constant supply of direct current to flow in a first direction through current connections whenever the current reversing switches are set in a first position, and in a second direction whenever the current reversing switches are set in a second position. The pulsed DC power supply 112 may also include a circuit for generating a direct current that flows between the anode 106 and the target 108 in the plasma chamber 102.

Continuing with FIG. 3, the anode monitor system 114 including a voltage monitor 116 may be configured to detect a first anode voltage at a first process variable value. The first process variable may be one or more of power, current (e.g. $I_1$ as shown), process gas partial pressure, temperature, and process gas flow rate (detected e.g. by the mass flow controller 126).

The datastore 118 may be configured to store uncoated anode characterization data, which may include a first expected anode voltage stored in association with the first process variable value (e.g. a current value, such as, in some examples, $I_1$). In some embodiments, the datastore 118 may store one or more data sets, with each data set including an expected voltage that, for a clean anode, would be the result of a given process current (e.g. process variable) applied to the anode at a given power (see, e.g., FIG. 1). In some embodiments, the datastore 118 may store data sets having one or more of an expected voltage, an expected current, an expected temperature, an expected partial pressure of a gas, and an expected gas flow that would be associated with a given power applied to a clean anode.

Throughout this document, the datastore 118 is characterized as a device that may store uncoated anode characterization data, such as data sets or data pairs, that may map the expected relationship between a process variable (e.g. current, gas flow rate, gas partial pressure, power, and/or temperature) and an expected associated value such as a voltage value. In practical terms, in some embodiments, a manufacturer or other provider may populate the datastore 118 with anode characterization data for one or more typical clean anodes prior to delivery to the end user. It is also contemplated, however, that the end user or operator populates the datastore 118 on-site, such as at system start-up. In this situation, for example, the operator may assume that a new anode 106 placed within the system 100 is clean/healthy, and cycle the system 100 to populate the datastore 118 with initial readings of process variables to generate data sets in the initial stages, before the anode 106 becomes coated. When the anode 106 is depleted, the operator may replace the anode 106 and re-populate the datastore 118 with new data sets associated with the replacement anode. In some embodiments, if the replacement anode is sufficiently similar to a previous anode that would yield tolerable variations in efficiency or performance attributes, a re-population of the datastore 118 may not be necessary.

Continuing still with FIG. 3, the anode sputtering adjustment system 120 is now discussed in further detail. Notably, the anode analysis component 122 may generate a health value for the anode 106 by evaluating differences between a first or actual anode voltage with an expected anode voltage.

In some examples, the anode analysis component 122 may generate a health value that is indicative of a difference between the first or actual anode voltage and the expected anode voltage. A greater difference indicates the anode 106 is less healthy (e.g. has more surface that is coated with a dielectric material) than it is when there is a smaller difference between the actual anode voltage and expected anode voltage.

In another example, and without limitation, a value of "1" may be generated to indicate that the anode 106 is healthy, clean or uncoated, after determining that the actual anode voltage is within an acceptable tolerance of the expected anode voltage. Similarly, a value of "0" may be generated to indicate that the anode 106 is unhealthy, dirty, or coated with dielectric material, after determining that the actual anode voltage is not within an acceptable tolerance of the expected anode voltage. Other embodiments and methods relating to determining the health of the anode 106 will be discussed in subsequent sections of this document.

Continuing still with FIG. 3, the anode power controller 124 may receive the first health value, such as a "0" or a "1", and provide an anode-energy-control signal to the pulse controller 140 of the pulsed DC power supply 112. For example, without limitation, the anode power controller 124 may provide an anode-energy-control signal by way of a control lead 138 to increase a length of time for applying the anode sputtering energy and/or increase the magnitude of the voltage applied during the application of anode sputtering energy, when the anode analysis component 122 has generated a health value, such as "0", indicating the anode 106 is coated with a dielectric material and/or unhealthy. In effect, by providing the anode-energy-control signal through lead 138 to the pulsed DC power supply 112, the anode power controller 124 may send an anode-energy-control signal to the pulsed DC power to adjust a second or subsequent anode sputtering energy relative to a first anode sputtering energy to eject at least a portion of a dielectric material from the anode 106.

It should be understood that FIG. 3 is a logical depiction of functional components, and is not intended to be a hardware diagram. The depicted components may be realized by common components, or they may be realized by separate components. In another example, the anode monitor system 114, the anode sputtering adjustment system 120, and the datastore 118 may be realized by a unitary system. In another example, the datastore 118 may be a separate component, such as a remote storage component. Those of skill in the art will understand that other combinations or divisions are possible.

Figure 3A:
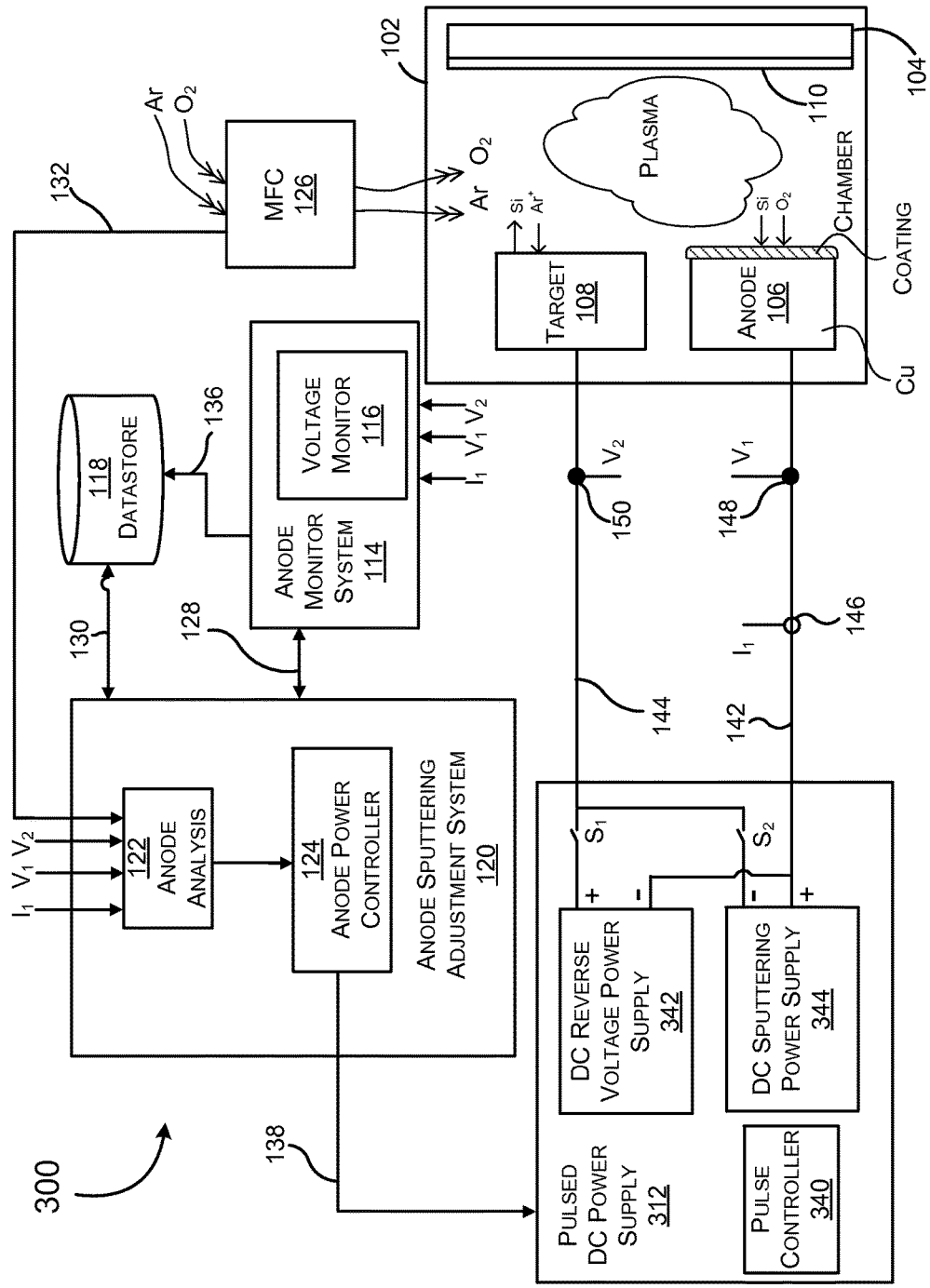
FIG. 3A illustrates an exemplary system for single magnetron sputtering including a schematic representation of a pulsed DC power supply that may be utilized to realize the pulsed DC power supply described with reference to FIG. 1.

Referring to FIG. 3A, shown is a system 300 with an exemplary pulsed DC power supply 312 that may be utilized to realize the pulsed DC power supply 112 described with reference to FIG. 3. As shown, the pulsed DC power supply 312 includes a pulse controller 340, a DC reverse voltage power supply 342, and a DC sputtering power supply 344. In this embodiment, the DC reverse voltage power supply 342, and the DC sputtering power supply 344 are separate DC power supplies that are switchably coupled to the target 108 and the anode 106. The pulse controller 340 may control switches $S_1$ and $S_2$ in a manner suitable for alternatingly applying a sputtering power and a reverse power by alternatingly closing the first switch $S_1$ and the second switch $S_2$. When $S_1$ is open and $S_2$ is closed, the anode 106 experiences a positive voltage and sputtering will occur. When $S_2$ is open and $S_1$ is closed, the anode 106 experiences a negative voltage and at least a portion of dielectric material deposited on the anode 106 may be ejected. Those skilled in the art will understand that when $S_2$ is open and $S_1$ is closed, a positive potential from the DC sputtering power supply 344 is not applied.

The pulse controller 340 may operate the first and second switches $S_1$ and $S_2$ in a manner that is responsive to the health values generated by the anode sputtering adjustment system 120. That is, the pulse controller 340 generally operates to control the DC reverse voltage power supply 342 and the DC sputtering power supply 344 in response to a control signal (sent via the control signal lead 138) from the anode power controller 124. More specifically, the pulse controller 340 is configured to adjust the reverse potential magnitude and/or duty cycle of the reverse potential in response to the control signal.

In the alternative to using two separate DC power supplies, the pulsed DC power supply 112 in some embodiments may include features described or illustrated in commonly assigned US Patent Publication US2014/0231243, published Aug. 21, 2014 ("the '243 publication"), the entire contents of which are herein incorporated by reference. In some embodiments, the pulsed DC power supply 112 may include circuitry as described in the '243 publication that provides a desired reverse pulse agility.

Figure 4:
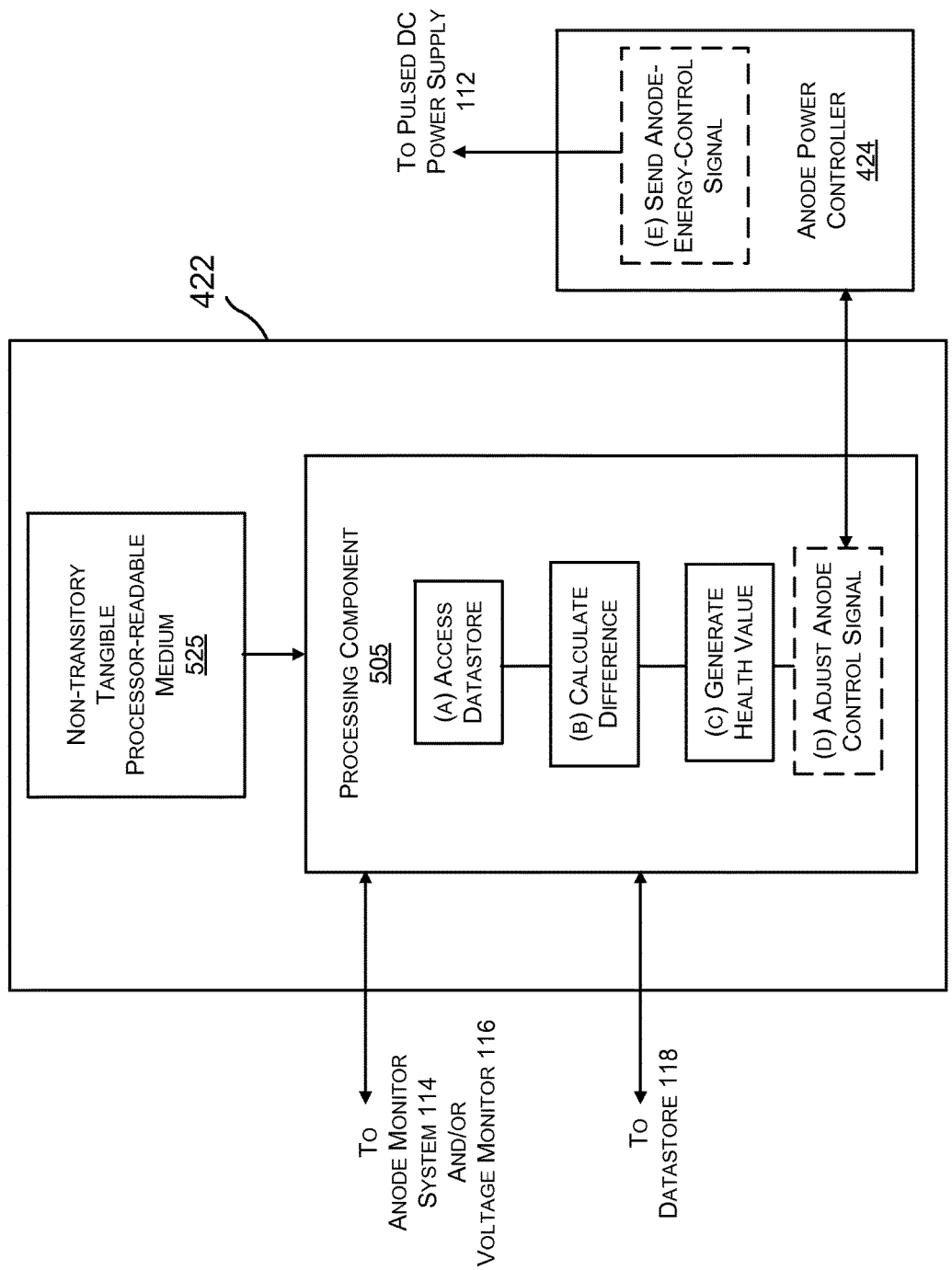
FIG. 4 illustrates an exemplary anode analysis component.

Turning now to FIG. 4, some embodiments of the anode analysis component 422 and the anode power controller 424 are now discussed. In some embodiments, the anode analysis component 422 includes a processing component 505 operatively coupled to the anode monitor system 114 and/or voltage monitor 116, and a non-transitory tangible processor-readable medium 525 (e.g., non-volatile memory). The non-transitory tangible processor-readable medium 525 may include instructions that, when executed by the processing component 505, cause the processing component 505 to (a) access, using a process variable value (e.g. power, current, process gas flow rate, process gas partial pressure), the datastore 118 to obtain the expected voltage value; (b) calculate a difference between a detected or actual anode voltage and the first expected anode voltage; and (c) generate a first health value based upon the difference between the detected or actual anode voltage and the first expected anode voltage.

The non-transitory tangible processor-readable medium 525 may optionally cause the processing component 505 to (d) adjust an anode-energy-control signal value. An adjusted anode-energy-control signal value may be shared with the anode power controller 424. The anode power controller 424 may (e) send an anode-energy-control signal to the pulsed DC power supply 112 based on the adjusted anode control signal value generated by the processing component 505. In some embodiments, the non-transitory tangible processor-readable medium 525 may optionally cause the anode power controller 424 to send the anode-energy-control signal to the pulsed DC power supply 112.

Figure 5:
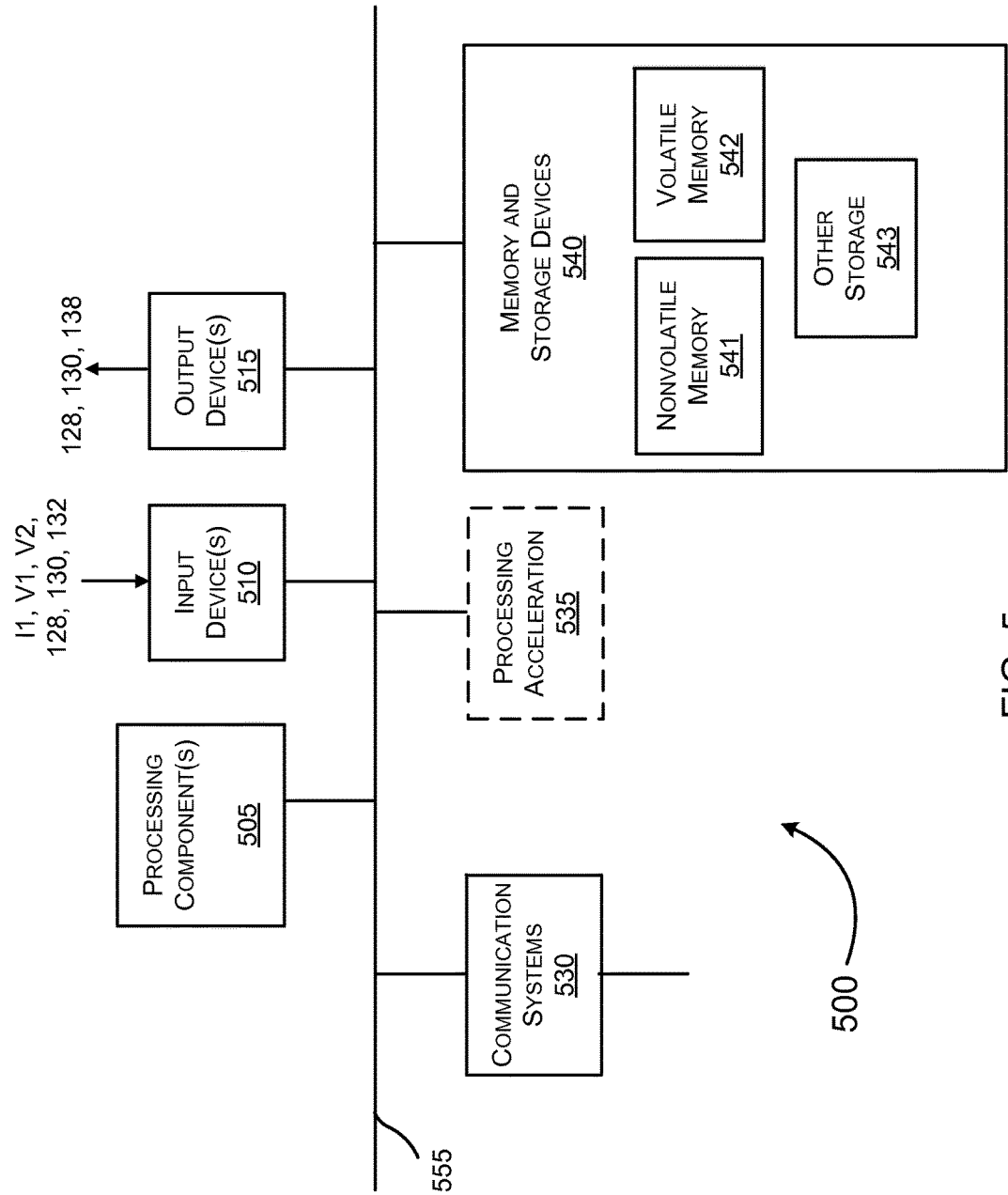
FIG. 5 illustrates a processing system according to some examples.

Turning now to FIG. 5, the anode sputtering adjustment system 120, and in particular the anode analysis component 122, 422 may be implemented or performed with a processing system 500. The processing system 500 may include a bus 555 electrically coupling one or more processing components 505, one or more input devices 510, one or more output devices 515, a non-transitory tangible processor-readable medium 525, a communications system 530, a processing acceleration 535, and one or more memory and storage devices 540. The components in FIG. 5 are examples only and do not limit the scope of use or functionality of any hardware, hardware and software, firmware, embedded logic component, or a combination of two or more such components implementing particular embodiments of this disclosure. Some or all of the illustrated components can be part of the processing system 500.

The processing component(s) 505 may include one or more of a digital signal processor (DSP), microprocessor, an application specific integrated circuit (ASIC), a field programmable gate array (FPGA) or other programmable logic device, discrete gate or transistor logic, discrete hardware components, or any combination thereof designed to perform the functions described herein. The processing component(s) 505 may also be implemented as a combination of computing devices, e.g., a combination of a DSP and a microprocessor, a plurality of microprocessors, one or more microprocessors in conjunction with a DSP core, or any other such configuration.

The input devices 510 may include leads receiving signals indicative of a first current $I_1$, a first voltage $V_1$, a second voltage $V_2$, and/or leads 128, 130, 132 receiving signals from the anode monitor system 114, the datastore 118 and/or a mass flow controller 126 respectively. The input device(s) 510 may also include user input devices such as a mouse, a keyboard, etc. for allowing user input and control of the processing system 500.

The output devices 515 may include signal drivers and leads 128, 130, 138 transmitting analog or digital signals from the processing system 500 to the anode monitor system 114, and/or the pulsed DC power supply 112 respectively, allowing the processing system 500 to operate the anode monitor system 114. For example, the output device(s) 515 may enable the processing system 500 or anode sputtering adjustment system 120 to instruct the voltage monitor 116 through lead 128 to begin or stop collecting processing signals for storage in the datastore 118, either directly through lead 136 or after processing through the anode sputtering adjustment system 120 or processing system 500. If the datastore 118 is implemented as a separate storage device, the output device(s) 515 may also provide the datastore 118 with data sets after processing by way of lead 130. The output device(s) 515 may also send adjusted anode control signals to the pulsed DC power supply 112 by way of lead 138. Similarly, the output devices 515 may include outputs for providing a user with feedback, such as a display device, an audible warning signal, a printer, control signals, etc.

The communications system 530 may permit data to be exchanged with a network and/or any other processing system described above with respect to the system 100. The processing system 500 may also include one or more memory and storage devices 540, including nonvolatile memory 541, volatile memory 542, and/or other storage 543.

The nonvolatile memory 541 is non-transitory memory that functions to store (e.g., persistently store) data and processor executable code (including executable code that is associated with effectuating the methods described herein). In some embodiments for example, the nonvolatile memory 541 includes bootloader code, operating system code, file system code, and may be used to realize the non-transitory tangible processor-readable medium 525 to facilitate the execution of a method described with reference to FIGS. 4 and 13 herein. In addition, the non-volatile memory 541 may be utilized to realize the datastore 118 described with reference to FIG. 1 and the look up table 614 described with reference to FIG. 6.

In many implementations, the nonvolatile memory 541 is realized by flash memory (e.g., NAND or ONENAND memory), but it is contemplated that other memory types may be utilized as well. Although it may be possible to execute the code from the nonvolatile memory 541, the executable code in the nonvolatile memory 541 is typically loaded into volatile memory 542, which typically includes random access memory such as a RAM drive, and executed by one or more of the processing components 505 in the processing system 500.

The processing component(s) 505 in connection with the volatile memory 542 or RAM generally operate to execute the instructions stored in nonvolatile memory 541 to maintain a healthy anode. For example, non-transitory processor-executable instructions to effectuate the methods described with reference to FIGS. 1 through 4 may be persistently stored in nonvolatile memory 541 and executed by the processing component(s) 505 in connection with the volatile memory 542. As one of ordinary skill in the art will appreciate, the processing component(s) 505 may include a video processor, digital signal processor (DSP), graphics processing unit (GPU), and other processing components.

Collectively, the other storage 543 may include disk drives, read-only memory ("ROM"), optical storage devices, and the volatile memory 542 may include solid-state storage device such as a random access memory ("RAM"). The memory and storage device(s) 540 may comprise the datastore 118 and/or be coupled to the datastore 118.

Again the non-volatile memory 541 may be used to realize the non-transitory tangible processor-readable medium (or media) 525 and may include instructions that, when executed by the processing component(s) 505, cause the processing component (s) 505 to (a) access, using a process variable value (e.g. power, current, process gas flow rate, process gas partial pressure), the datastore 118 to obtain the expected voltage value; (b) calculate a difference between a detected or actual anode voltage and the first expected anode voltage; and (c) generate a first health value based upon the difference between the detected or actual anode voltage and the first expected anode voltage.

The non-transitory tangible processor-readable medium 525 may optionally cause the processing component (s) 505 to (d) adjust an anode-energy-control signal value. An adjusted anode-energy-control signal value may be shared with the anode power controller 124, 424. The anode power controller 124, 424 may (e) send an anode-energy-control signal to the pulsed DC power supply 112 based on the adjusted anode control signal value generated by the processing component(s) 505.

In some embodiments, the processing system 500 may also include a processing acceleration unit 535, which can include a DSP, a special-purpose processor and/or the like.

In embodiments where the processing components 505 include an FPGA, upon boot up, the FPGA may be configured with non-transitory instructions (e.g., stored in non-volatile memory 541) to effectuate one or more aspects of the methods and functions described herein. And some embodiments, a processor may execute non-transitory instructions to effectuate some functions of the anode analysis component 122 while an FPGA is configured with non-transitory instructions to effectuate other functions of the anode analysis component 122.

It should be understood that alternate embodiments of a processing system 500 may have numerous variations from that described herein. For example, customized hardware might also be used (see e.g. FIG. 6) and/or particular elements might be implemented in hardware, or both hardware and software.

Figure 6:
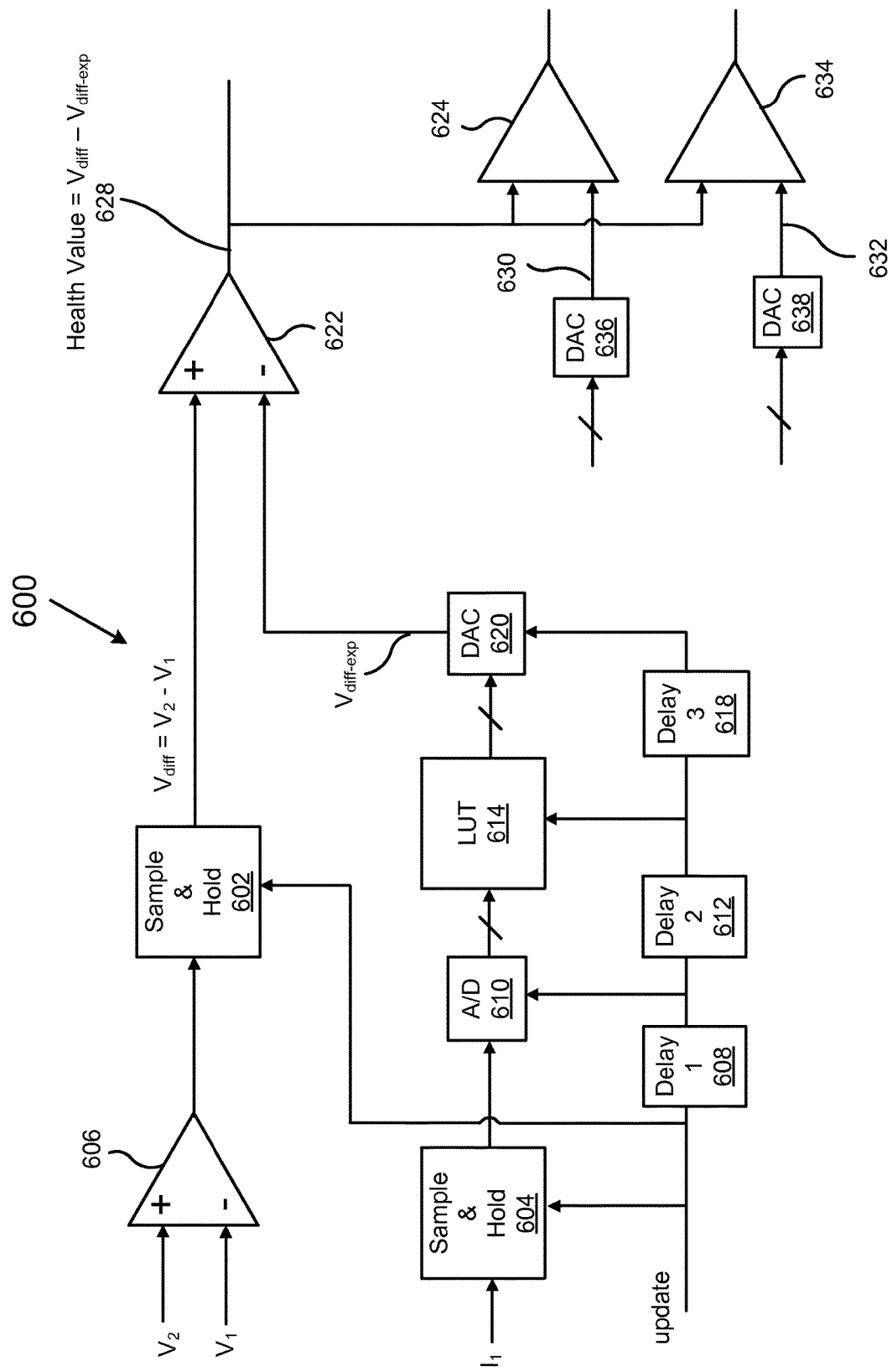
FIG. 6 illustrates an exemplary hardware control system.

Turning now to FIG. 6, one embodiment of a hardware control system 600 that may be employed in the anode sputtering adjustment system 120 or the anode analysis component 122 is now described. The hardware control system 600 may include a means for receiving an anode voltage V1 and a target voltage $V_2$, or receiving a scaled representation of the anode and target voltages $V_1$, $V_2$, such as by way of leads 148, 150 at a differential amplifier 606. The difference between $V_1$ and $V_2$ is amplified according to means known in the art, and results in an analog signal indicative of the voltage differential $V_{diff}$ between the anode voltage $V_1$ and the target voltage $V_2$. Because the voltage differential $V_{diff}$ is a constantly changing value, the system 600 may be configured to, responsive to an update signal, sample and hold the voltage differential $V_{diff}$ according to means known in the art, including using an independent sample and hold device 602 or circuit, or sample and hold functionality integral to the differential amplifier 606.

Also responsive to the update signal, a second sample and hold device 604 may have means for receiving a first current $I_1$ or a signal that is a scaled representation of the first current $I_1$, such as from current sensor 146. Because the first current $I_1$ may be received as an analog signal, an analog to digital converter 610 may convert the analog representation of the first current $I_1$ to a digital signal. A lookup table 614 is provided to, upon receiving the digitalized value of the first current $I_1$, output a digital signal representative of an expected voltage differential $V_{diff-exp}$ that is derived from an expected voltage differential of a system 100 with a clean anode 106. A digital to analog converter 620 may convert the digitalized signal to an analog representation of the expected voltage differential $V_{diff-exp}$. Reference values may be written to other digital to analog convertors 636, 638 by the control system for purposes to be described in later portions of this disclosure.

A second differential amplifier 622 may detect and amplify the difference between the detected voltage differential $V_{diff}$ and the expected voltage differential $V_{diff-exp}$, and output the resulting health value 628 to one or more comparators 624, 634.

A first comparator 624 may be provided to receive the health value 628 from the second differential amplifier 622 and an analog representation of a first reference value 630, such as from the lookup table 614. The first reference value 630 may be a magnitude of a tolerable level of deviation from the expected voltage differential $V_{diff-exp}$, and the first comparator 624 may be configured to compare the difference between the health value 628 and the first reference value 630. The first reference value 630 may be derived from the voltage-current relationships illustrated in FIG. 1. If the health value 628 deviates beyond the first reference value 630 at the sampled current $I_1$, the first comparator 624 may output a signal indicative that the anode 106 is unhealthy, such as a 0. Otherwise, the comparator 624 may indicate the anode 106 is healthy, such as by outputting a 1. An output of 0 from the first comparator 624 may trigger an automatic change in the sputtering process, such as by increasing the sputtering voltage or time, or the output may trigger an alarm requiring action from an operator, or both. Other responses are contemplated, as will be understood by those skilled in the art.

A second comparator 634 may also receive the health value 628 and a second reference value 632. The second reference value 632 may be a second level of deviation from the expected voltage differential $V_{diff-exp}$ that may indicate the anode 106 is not necessarily unhealthy, but instead partially coated or approaching an unhealthy state. If the health value 628 deviates beyond the second reference value 632 at the sampled current $I_1$, the second comparator 634 may output a signal indicative that the anode 106 is approaching an unhealthy state, such as 0, which may trigger an indicator for an operator to, if desired, take preventative measures and prevent the anode 106 from reaching an unhealthy state, with other responses contemplated as well. Otherwise, the comparator 634 may indicate the anode 106 is not approaching an unhealthy state, such as by outputting a 1.

While the system 600 has been described above using a particular set of hardware, those of skill in the art will understand that other hardware may be implemented to achieve varying levels of control. To give just one example, a variety of comparators could be implemented to add a time element to the comparison; that is, if the anode 106 is approaching an unhealthy state at a fast rate, a comparator may configured to indicate the fast approach, allowing the system 100 or operator to take preventative measures. Because the system 600 may provide some or all functions of the anode analysis component 122, other sections of this document related to the anode analysis component 122 and anode sputtering adjustment system 120 provide details as to how the system 600 may be employed.

Figure 7:
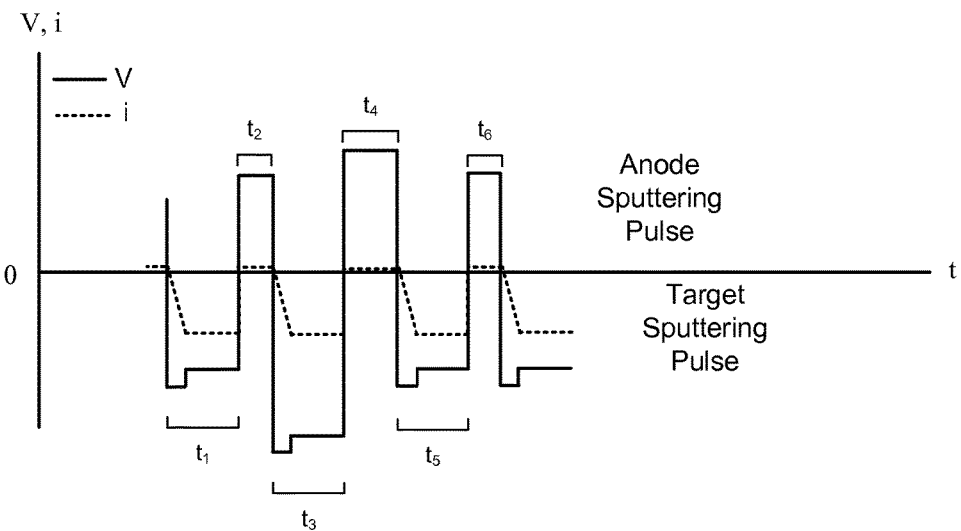
FIG. 7 illustrates an exemplary sputtering pulse methodology.

Turning now to FIG. 7 in conjunction with FIGS. 3-3A, details of the sputtering process are now discussed. FIG. 7 is a graphical representation of how power (voltage and current) may be applied over time in a single magnetron sputtering system. At a high level, target sputtering pulses are applied, separated by anode sputtering pulses. The target sputtering pulses cause a thin film 110 to be formed on the substrate 104, while the anode sputtering pulses cause undesirable dielectric material to be ejected from the anode 106.

In the specific example shown, a first time period $t_1$ and a second time period $t_2$ illustrate target and anode sputtering pulses, respectively, associated with a clean anode. As the anode 106 becomes coated, a third time period $t_3$ illustrates how the magnitude of the voltage must be increased to maintain the same target sputtering power. During the third time period $t_3$, (or any time period in some embodiments), the system 100 may generate a health value, such as "0", indicating the anode 106 is coated, dirty, or unhealthy.

In some embodiments, the system 100 may cause a subsequent anode sputtering pulse, such as during a fourth time period $t_4$, to apply a greater anode sputtering energy than was applied during the second time period $t_2$. Because energy is power for a time period, the energy may be increased by increasing the magnitude of the voltage applied and/or increasing the length of time that the anode sputtering power is applied. In FIG. 7, both the time period $t_4$ and the magnitude of the voltage are increased.

Continuing with FIG. 7, once a health value is generated that indicates the anode 106 has returned to an uncoated, clean, or healthy state, such as based on variables taken during the fifth time period $t_5$, the anode sputtering adjustment system 120 may revise the anode sputtering energy, such as during a sixth time period $t_6$, to apply a default anode sputtering energy, perhaps the same energy applied during the second time period $t_2$. It should be understood that the first through sixth time periods $t_1$-$t_6$ do not necessarily, and most likely do not, follow directly behind one another. That is, it may take several cycles to eject enough dielectric from a coated anode 106 before the anode 106 can be classified as healthy, clean, or uncoated.

Figure 8:
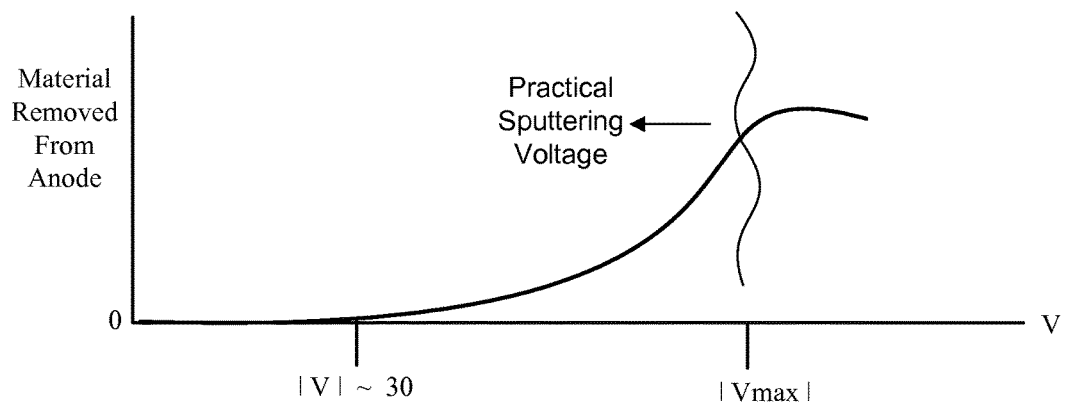
FIG. 8 graphically illustrates anode sputtering efficiency relative to a voltage applied.

Turning now to FIG. 8, the magnitude of the anode sputtering voltage V may in some embodiments be set at a minimum of about 30 Volts, because below 30 Volts may not be sufficient to remove enough material from the anode 106 to improve the performance of the anode 106. It should, however, be understood that there is associated with each anode a maximum suitable voltage magnitude $V_{max}$ beyond which material removal rates begin to decline, as illustrated in FIG. 8. The maximum suitable voltage magnitude $V_{max}$ depends on the type of anode used; however, it should be understood that the system 100 may be configured to limit the magnitude of the voltage applied during an anode sputtering pulse to ensure maximum efficiency of the system.

Figure 9:
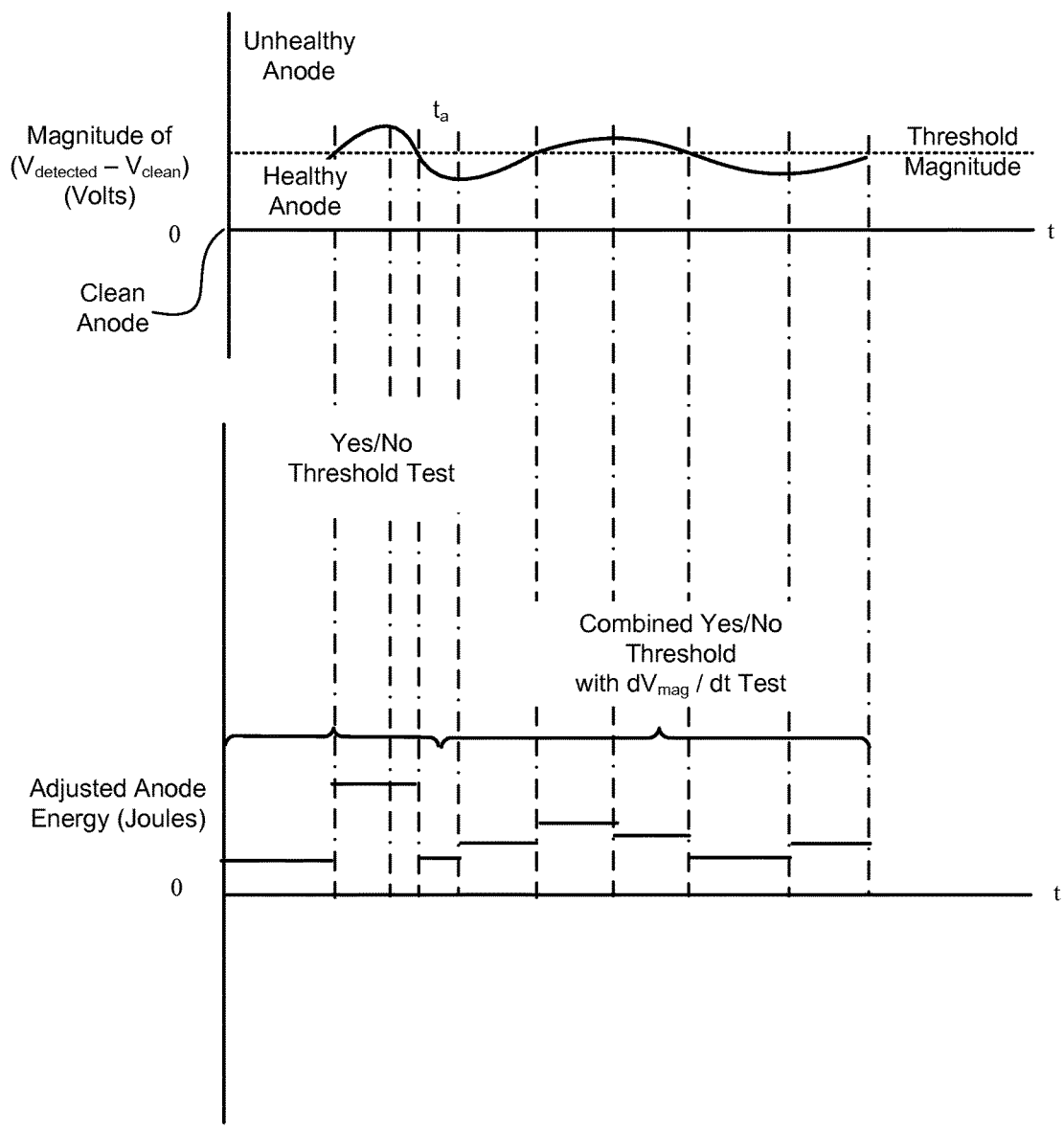
FIG. 9 graphically illustrates relationships between anode health and pulse energies in some examples.

Turning now to FIG. 9, various methods of generating a health value are now discussed. In previous sections, this document has referenced an anode 106 that may be characterized as clean, uncoated, or healthy; or dirty, coated, or unhealthy. In some embodiments, these terms are interchangeable; for example, a healthy anode may be clean and uncoated, while an unhealthy anode may be dirty and coated. However, in some embodiments, an anode may be characterized as "unhealthy" even if it is not yet coated or dirty; for example, if the system 100 detects that the anode 106, while not yet coated, is approaching a state of being coated, a health value of "unhealthy" or "0" may be generated, thus giving the system 100 and/or the operator the opportunity to preemptively adjust the anode sputtering energy to maintain efficiency of the system 100.

FIG. 9 illustrates how the above method might be applied. In FIG. 9, the top graph illustrates how the difference between the voltage detected and the expected voltage changes over time as the anode 106 becomes coated with a dielectric material or is cleansed of dielectric material. The earlier time periods, up to about time $t_a$, illustrate how the difference might change if a yes/no threshold test is used to generate an anode health value, while the later time periods after time $t_a$ illustrate how the difference might change if the yes/no threshold test is applied in combination with a change in the difference over time to generate an anode health value.

Relatedly, the lower graph of FIG. 9 illustrates how the adjusted anode energy, in Joules, might change over time when using the yes/no threshold test to generate an anode health value (up to about time $t_a$), or the yes/no test in combination with a change in difference over time (starting at about time $t_a$).

Note how combining the two tests to generate an anode health value may reduce the fluctuation of both the anode energy and the anode coating state, which may, in turn, improve the efficiency of the system 100.

To describe more explicitly, as illustrated in earlier time periods up to time $t_a$, the anode analysis component 122 may evaluate the difference between the magnitude of the detected anode voltage $V_{detected}$ and the expected anode voltage $V_{clean}$ associated with a clean anode. If the difference is greater than a tolerable threshold magnitude which is indicative of an anode that is coated or dirty, the anode analysis component 122 may generate a negative health value, such as "0", to indicate the anode 106 is unhealthy and optionally generate an adjusted anode-energy-control signal value. In response to the health value and/or the adjusted-anode-energy-control signal value, the anode power controller 124 may provide an anode-energy-control signal by way of a control lead 138 to the pulse controller 140 to increase a length of time for applying an anode sputtering energy and/or increase the magnitude of the voltage applied during the application of anode sputtering energy, such as illustrated in FIG. 7 at the fourth time period $t_4$ and in FIG. 9 just prior to time $t_a$.

Continuing with FIG. 9, in some embodiments, the anode analysis component 122 may evaluate the difference between the magnitude of the detected anode voltage $V_{detected}$ and the expected anode voltage $V_{clean}$ associated with a clean anode, as described above, and additionally evaluate the change in the anode voltage magnitude over time. This combination may allow the system 100 to generate an anode health value of "unhealthy" or "0" even if the anode 106 is not actually yet coated or dirty, but is approaching a state of being coated or dirty. Generating the anode health value using this method may allow the system 100 to preemptively adjust the anode sputtering energy before the anode 106 is actually coated, such as when it appears the anode 106 is approaching, but has not yet reached, a coated state. As stated above, this method may improve the efficiency of the system 100.

Figure 10:
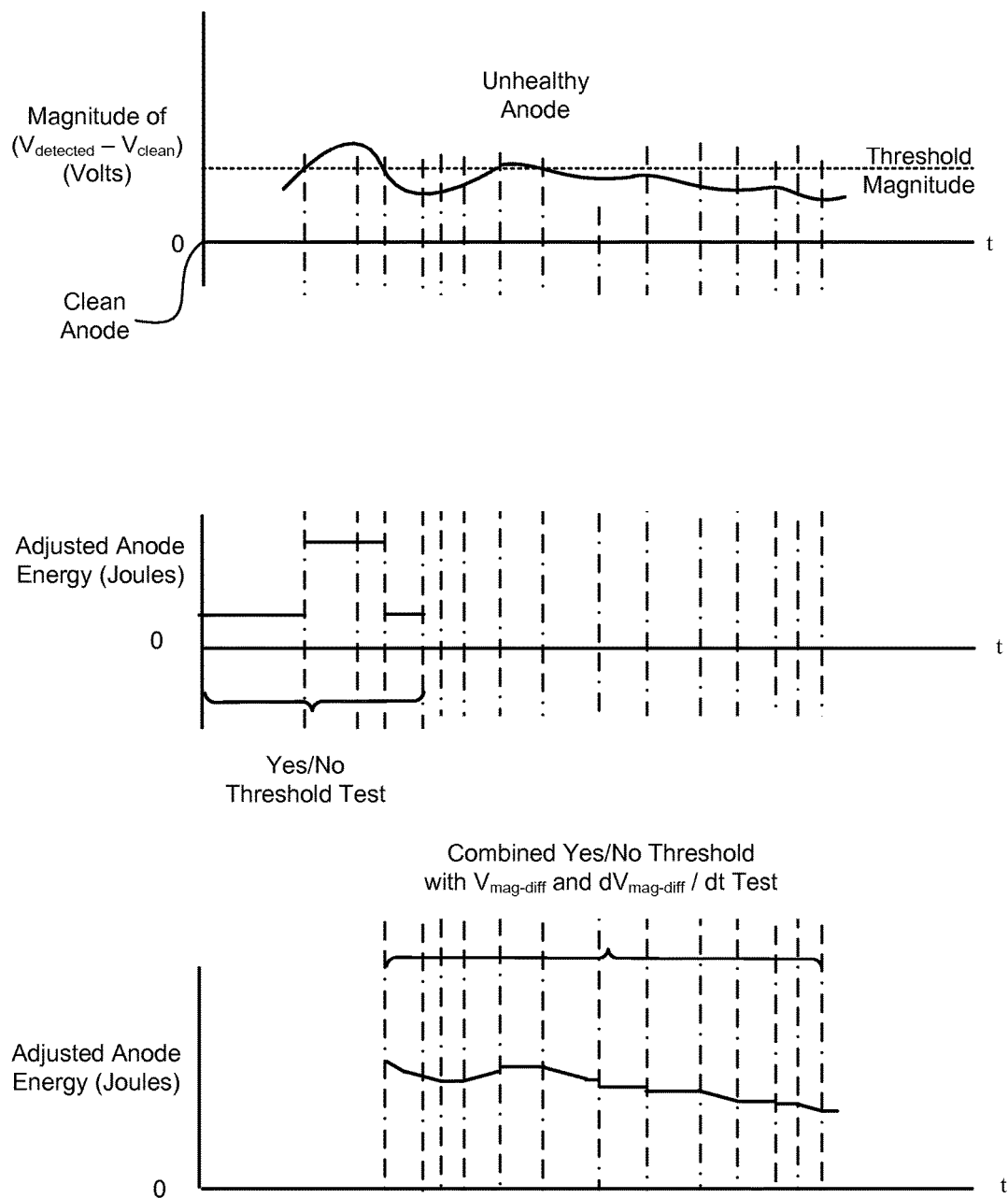
FIG. 10 graphically illustrates relationships between anode health and pulse energies in some examples.

Turning now to FIG. 10, still another method may be applied to generate an anode health value and adjust the anode sputtering energy. FIG. 10 illustrates how the yes/no test may be combined with a voltage magnitude differential and a change in magnitude differential over time. That is, the anode analysis component 122 may evaluate whether or not the anode 106 is coated, how close the anode 106 is to being coated, and how quickly the anode is approaching a coated state to generate an anode health value. Here, the anode analysis component 122 may generate an anode health value that indicates the anode is healthy "1", unhealthy "0", healthy but approaching unhealthy "10", or unhealthy but approaching healthy "01", and/or others. By evaluating each of these values, the anode analysis component 122 may generate over time health values that limit abrupt changes in the adjusted anode energy, resulting in a highly efficient system 100. In some embodiments, the system 100 or anode analysis component 122 may generate multiple health values over time, and compare a change in the health values over time, such as comparing a second health value and a first health value relative to a period of time. Those of skill in the art will recognize that numerous controls techniques may be applied by the anode analysis component 122 to maximize the use of information gathered by the anode monitor system 114.

Those of skill in the art will also recognize that, although voltage is primarily discussed as useful in generating an anode health value, other data sets may be used, such as power related to a process gas flow rate or partial pressure In some embodiments, in response to the anode analysis component 122 generating an anode health value that indicates the anode 106 is unhealthy, the system 100 may, instead of, or in addition to causing the pulsed DC power supply 112 to adjust the anode sputtering energy, cause one or more of the output device(s) 515 to emit a warning to the operator. The warning may be any audible, visual, or tactile output and may be one or more of the output device(s) 515 described with reference to FIG. 5.

Figure 11:
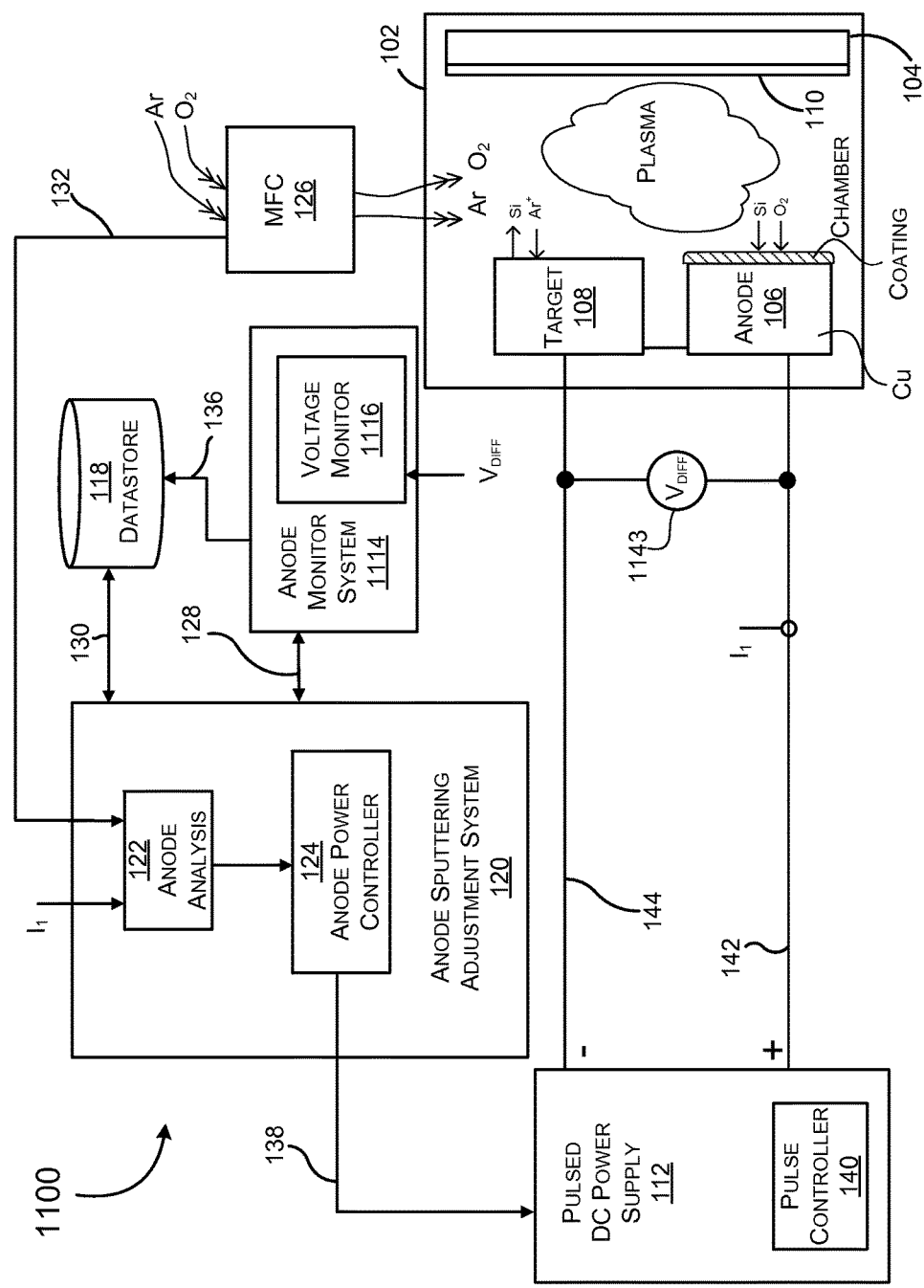
FIG. 11 illustrates a system for single magnetron sputtering in some examples.

Turning now to FIG. 11, the voltage monitor 1116 in the anode monitor system 1114 may include or be operatively coupled to a voltage sensor 1143 to obtain a voltage differential between the anode 106 and the target 108. For example, as illustrated in FIG. 11, the system 1100 is sputtering material from the target 108 to form the thin film 110, while a reversal of the polarity causes material to be ejected from the anode 106 instead.

Figure 12:
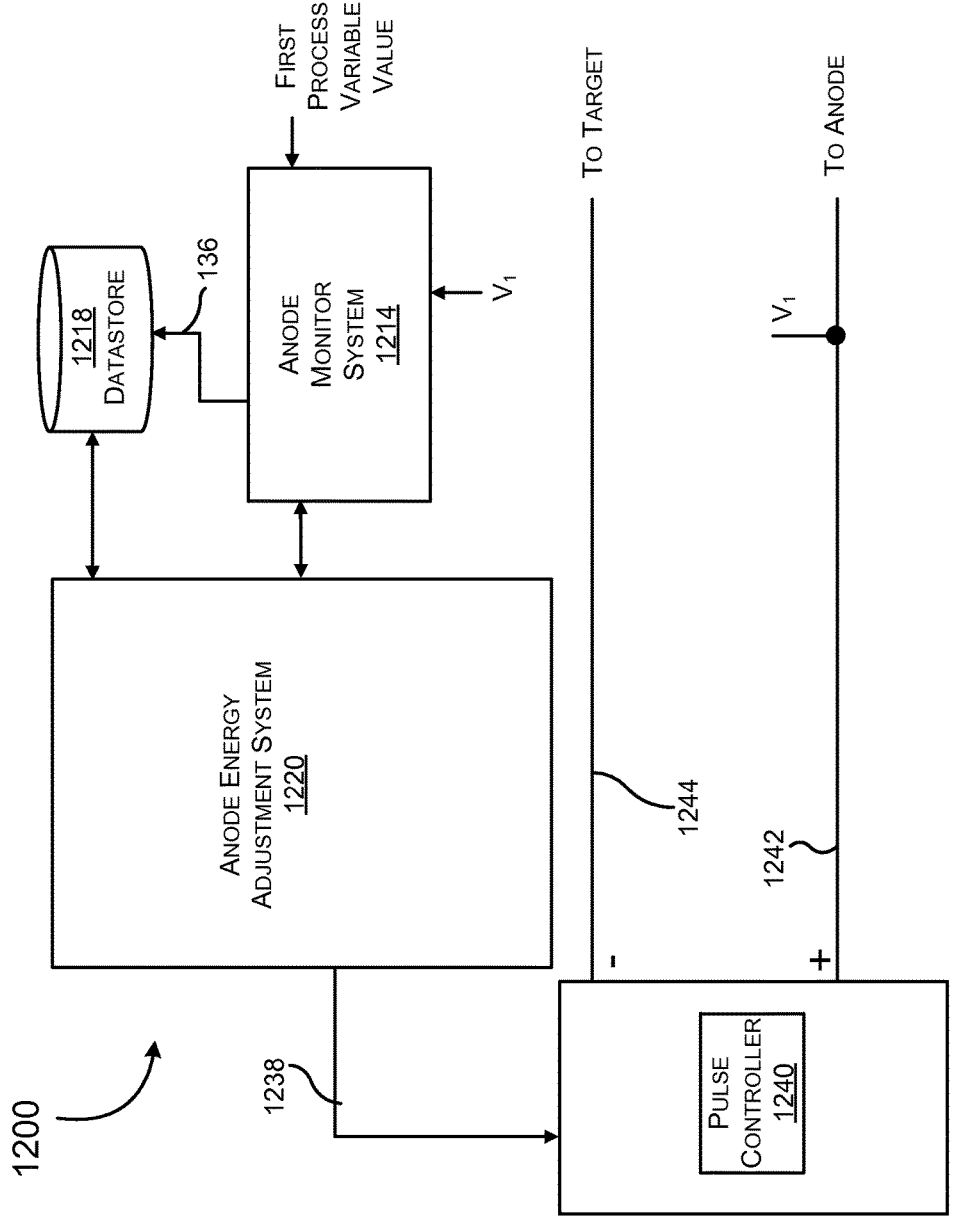
FIG. 12 illustrates an exemplary power supply system.

Turning now to FIG. 12, a related power supply system 1200, which may be a part of the system 100, is now discussed. The power supply system 1200 may be a system for a single magnetron sputtering system such as system 100, and includes a target lead 1244 to couple to a target, an anode lead 1242 to couple to an anode, a pulse controller 1240 to alternately apply target sputtering energy to the target lead 1244 and anode sputtering energy to the anode lead 1242. The power supply system 1200 also has an anode monitor system 1214 to monitor a voltage $V_1$ of the anode lead 1242, and a datastore 1218 configured to store uncoated anode characterization data including a first expected anode voltage stored in association with a first process variable value. The power supply system 1200 also has an anode energy adjustment system 1220 having an output 1238 to instruct the pulse controller 1240 to adjust the anode sputtering energy when the monitored anode voltage $V_1$ at the first process variable value is greater than a threshold deviation from the first expected anode voltage.

The anode energy adjustment system 1220 in the power supply system 1200 may include a processor and a non-transitory tangible processor-readable medium. The non-transitory tangible processor-readable medium may be encoded with processor readable instructions to perform a method for maintaining a health of the anode. The method may include accessing, using the first process variable value, the datastore to obtain the first expected voltage value; generating a first health value based upon the difference between the monitored anode voltage and the first expected anode voltage; and adjusting the anode sputtering energy value based upon the first health value. A sputtering system 100 may use the power supply system 1200 to eject material from the anode.

The anode monitor system 1214 in the power supply system 1200 may be configured to detect a first voltage differential between the anode lead and the target lead, and a second voltage differential between the anode lead and the target lead at a period of time from detecting the first voltage differential, and at a second process variable. The second process variable may have the same value as the first process variable. The non-transitory tangible processor-readable medium may have instructions that, when executed by the processor, cause the processor to: compare the second detected voltage differential to a second expected voltage differential to generate a second anode health value, and compare the second anode health value to the first anode health value relative to the period of time.

Figure 13:
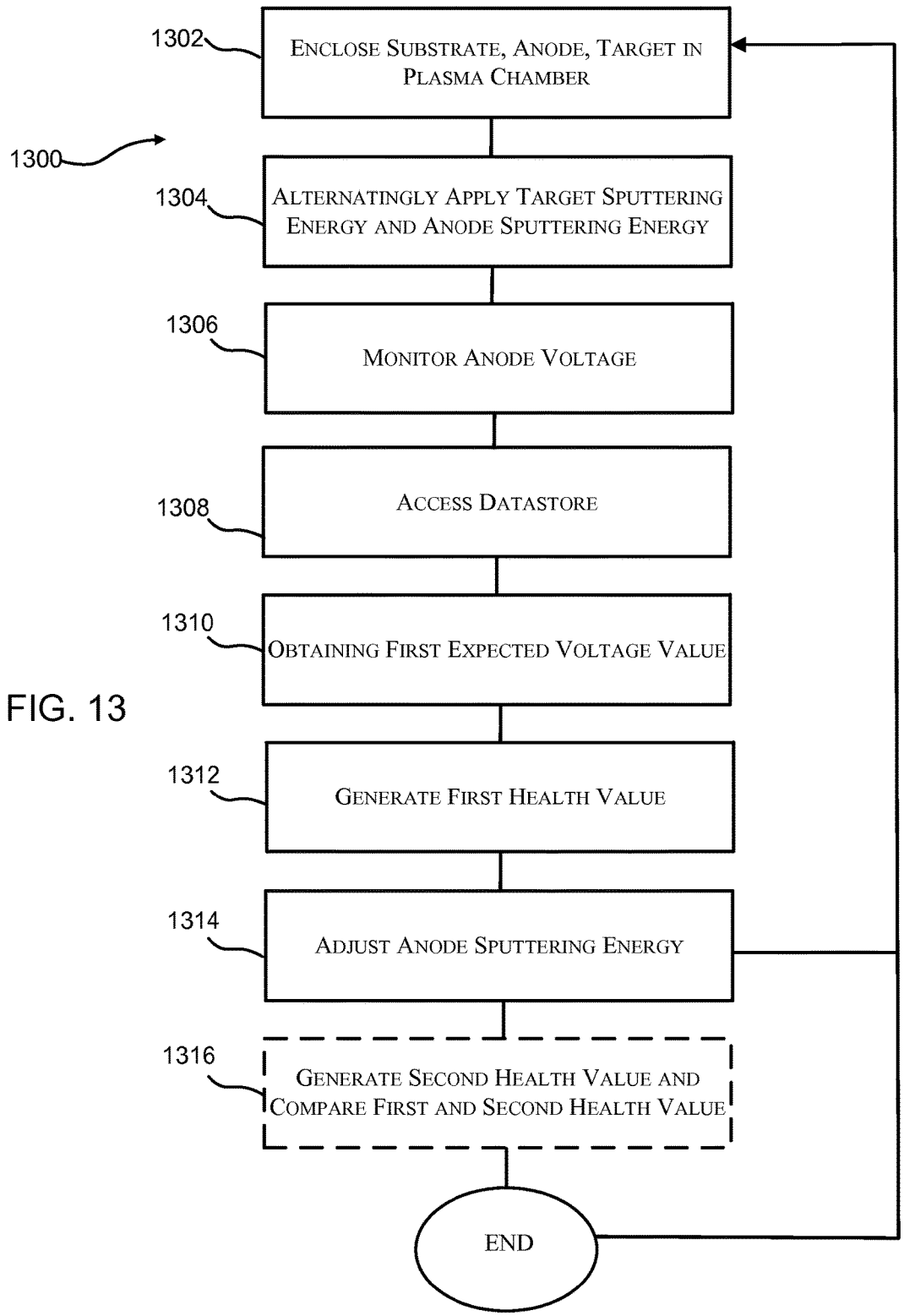
FIG. 13 is a flowchart of an exemplary method for single magnetron sputtering.

Turning now to FIG. 13, a method 1300 for single magnetron sputtering is now discussed. The method includes enclosing 1302 a substrate, an anode, and a target in a plasma chamber; alternatingly applying 1304 target sputtering energy and anode sputtering energy; monitoring 1306 the anode voltage; and accessing 1308 a datastore. The method 1300 also includes obtaining 1310 a first expected voltage value; generating 1312 a first health value; adjusting 1314 the anode sputtering energy; and generating 1316 a second health value and comparing the first and second health values.

Monitoring 1306 an anode voltage at a process variable value may include monitoring an anode voltage at a given current, power, process gas flow, temperature, and/or process gas partial pressure. For example, an anode monitor system such as the system 114, 1114 depicted in FIGS. 3 and 11 may monitor the current $I_1$ being applied to the anode 106, and the related anode voltage $V_1$ or the voltage differential $V_{diff}$ between the anode 106 and target 108.

Accessing 1308 a datastore includes accessing a datastore having uncoated anode characterization data derived from characteristics of an uncoated anode that is not coated with a dielectric material. The uncoated anode characterization data includes a first expected anode voltage defined by the uncoated anode characterization data of the uncoated anode at a first process variable value. Specifically, as an example, the uncoated anode characterization data may include data sets that provide a user and/or the anode sputtering adjustment system with information about how a voltage or voltage differential measured at the particular anode 106 in the system 100, 1100 respond as the anode 106 becomes coated. The data sets might be pairs of data, such as a voltage-current relationship, a voltage-power relationship, a voltage-gas relationship, or any combination thereof.

In some embodiments, the uncoated anode characterization data may be generated by starting up a sputtering system such as system 100, 1100 with a new anode 106, and, during the initial phases, causing the anode monitor system 114, 1114 to monitor a current across the anode 106, and either a voltage differential $V_{diff}$ between the target 108 and the anode 106 or a voltage at the anode $V_1$ and a voltage at the target $V_2$. As the voltage $V_1$, $V_2$, $V_{diff}$ is monitored, the anode monitor system 114, 1114 may share data sets having voltage values relative to current values with the datastore 118 and/or the anode sputtering adjustment system 120. At a designated time after start-up, the anode 106 may be declared unhealthy, dirty, or coated. At this time, the anode sputtering system 120 and/or the anode monitor system 114, 1114 may stop providing uncoated anode characterization data sets to the datastore 118. These data sets can then be used to evaluate ongoing health of the anode 106, and, as previously described, the data sets might include, for example, a voltage-current relationship, a voltage-power relationship, a voltage-gas relationship, or any combination thereof. It will be understood by those skilled in the art that data sets may continue to be supplied to the datastore 118 as an information gathering tool for, as one example, generating predictions about the total life expectancy of the anode 106.

In some embodiments, the uncoated anode characterization data may be generated by a manufacturer having knowledge (such as through past testing) of a voltage response curve relative to a current application for one or more new anodes, such as anode 106, which may be pre-populated into the datastore 118.

Obtaining 1310 a first expected voltage value comprises using the first process variable value to obtain the first expected voltage value from the datastore.

Generating 1312 a first health value comprises generating a first health value based upon the difference between the monitored anode voltage and the first expected anode voltage.

Adjusting 1314 the anode sputtering energy comprises adjusting the anode sputtering energy based upon the first health value to eject material from the anode. Adjusting 1314 the anode sputtering energy based upon the first health value may include generating an adjusted anode sputtering energy value and adjusting at least one of the anode sputtering voltage and a time the anode sputtering energy is applied to the anode. Adjusting 1314 the anode sputtering energy may also or alternatively include adjusting a magnitude of the anode sputtering voltage to greater than about 30 Volts.

The method 1300 may also include detecting, after a period of time, a second anode voltage at the first process variable value; generating a second health value based upon the difference between the second anode voltage and the first expected anode voltage; and comparing the second health value and the first health value relative to the period of time to determine a rate at which the anode is becoming coated.

The method 1300 may also include deriving the uncoated anode characterization data from the anode while the anode is uncoated; and populating the datastore with the uncoated anode characterization data.

The method 1300 may also include replacing the anode with a replacement anode; deriving the uncoated anode characterization data from the replacement anode while the replacement anode is uncoated; and populating the datastore with the uncoated anode characterization data derived from the replacement anode.

The method 1300 may be carried out by components in the system 100 and/or the power supply 1200 described with reference to FIGS. 1-12.

In conclusion, the present invention provides, among other things, a system and method for single magnetron sputtering. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A power supply system for a single magnetron sputtering system, the power supply system comprising:
    a target lead to couple to a target and an anode lead to couple to an anode;
    a pulsed DC power supply coupled to the target lead and the anode lead, the pulsed DC power supply is configured to generate and apply an alternating sputtering voltage at the target lead relative to the anode lead that alternates between a positive portion during an anode sputtering pulse and a negative portion during a target sputtering pulse,
    a pulse controller configured to control when the alternating sputtering voltage at the target lead alternates from the positive portion to the negative portion, and the pulse controller is configured to control an anode sputtering energy applied by the pulsed DC power supply during the anode sputtering pulse responsive to an anode-energy-control signal;
    an anode monitor system comprising a voltage monitor coupled to the anode lead and the target lead to measure the alternating sputtering voltage; and
    an anode sputtering adjustment system comprising:
        a processor;
        a non-transitory tangible processor-readable medium encoded with processor readable instructions, that when executed on the processor, cause the processor to:
            receive the measurements of the alternating sputtering voltage during multiple target sputtering pulses;
            determine when the negative portion of the alternating sputtering voltage increases more than the threshold deviation to maintain target sputtering power during the multiple target sputtering pulses; and
            provide the anode-energy-control signal to the pulse controller with a value to prompt the pulse controller to increase the anode sputtering energy to eject material from the anode when the negative portion of the alternating sputtering voltage increases more than the threshold deviation.

2. A power supply system for a single magnetron sputtering system, the power supply system comprising:
    a target lead to couple to a target and an anode lead to couple to an anode;
    a pulsed DC power supply coupled to the target lead and the anode lead, the pulsed DC power supply is configured to generate and apply an alternating sputtering voltage at the target lead relative to the anode lead that alternates between a positive portion during an anode sputtering pulse and a negative portion during a target sputtering pulse,
    a pulse controller configured to control when the alternating sputtering voltage at the target lead alternates from the positive portion to the negative portion, and the pulse controller is configured to control an anode sputtering energy applied by the pulsed DC power supply during the anode sputtering pulse responsive to an anode-energy-control signal;
    an anode monitor system comprising a voltage monitor coupled to the anode lead and the target lead to measure the alternating sputtering voltage; and
    an anode sputtering adjustment system comprising:
    a field programmable gate array coupled to the voltage monitor; and
    a non-transitory tangible medium comprising instructions that, when used to configure the field programmable gate array, cause the field programmable gate array to:
        receive the measurements of the alternating sputtering voltage during multiple target sputtering pulses;
        determine when the negative portion of the alternating sputtering voltage increases more than the threshold deviation to maintain target sputtering power during the multiple target sputtering pulses; and
        provide the anode-energy-control signal to the pulse controller with a value to prompt the pulse controller to increase the anode sputtering energy to eject material from the anode when the negative portion of the alternating sputtering voltage increases more than the threshold deviation.

* * * * *